(12) United States Patent
Rudolph

(10) Patent No.: US 9,831,795 B2
(45) Date of Patent: Nov. 28, 2017

(54) SYNCHRONOUS RECTIFIER

(71) Applicant: OSRAM GmbH, Munich (DE)

(72) Inventor: Bernd Rudolph, Forstern (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 15/023,007

(22) PCT Filed: Sep. 5, 2014

(86) PCT No.: PCT/EP2014/069014
§ 371 (c)(1),
(2) Date: Mar. 18, 2016

(87) PCT Pub. No.: WO2015/039900
PCT Pub. Date: Mar. 26, 2015

(65) Prior Publication Data
US 2016/0233786 A1    Aug. 11, 2016

(30) Foreign Application Priority Data

Sep. 20, 2013    (DE) .................. 10 2013 219 015

(51) Int. Cl.
*H02M 3/335*    (2006.01)
*H02M 7/217*    (2006.01)
(Continued)

(52) U.S. Cl.
CPC ............ *H02M 7/217* (2013.01); *H02M 7/06* (2013.01); *H03K 17/0424* (2013.01);
(Continued)

(58) Field of Classification Search
CPC .. H02M 1/34; H02M 2001/342; H02M 7/219; Y02B 70/1475
(Continued)

(56) References Cited

U.S. PATENT DOCUMENTS 5,481,219 A * 1/1996 Jacobs ............ H03K 17/04123
327/377
6,038,143 A * 3/2000 Miyazaki ............ H02M 3/3385
363/19

(Continued)

FOREIGN PATENT DOCUMENTS

DE        3932083 C1    4/1991
DE    102008018390    * 10/2009
(Continued)

OTHER PUBLICATIONS

German Office Action based on application No. 10 2013 2019 015.8 (7 pages) dated May 27, 2014 (for reference purpose only).
(Continued)

*Primary Examiner* — Rajnikant Patel
(74) *Attorney, Agent, or Firm* — Viering, Jentschura & Partner mbB

(57) ABSTRACT

Various embodiments may relate to a synchronous rectifier including at least one rectifier cell, to which power is supplied via a secondary winding of a transformer arranged between the input connections of the synchronous rectifier. The rectifier cell comprises a bipolar main switch operated in the inverse mode, wherein an energy store is provided in the base line of the bipolar main switch, which energy store, in conjunction with an auxiliary switch which is concomitantly controlled by the relevant secondary winding for the bipolar main switch, ensures that the main switch is switched off prior to the end of the inverse phase.

13 Claims, 3 Drawing Sheets

(51) Int. Cl.
*H03K 17/0412* (2006.01)
*H03K 17/0424* (2006.01)
*H03K 17/61* (2006.01)
*H02M 7/06* (2006.01)
*H03K 17/06* (2006.01)
*H03K 17/30* (2006.01)

(52) U.S. Cl.
CPC ....... *H03K 17/04126* (2013.01); *H03K 17/61* (2013.01); *H03K 2017/066* (2013.01); *H03K 2017/307* (2013.01)

(58) Field of Classification Search
USPC ...... 363/16–17, 21.01, 21.06, 21.12, 89, 93, 363/125, 127
See application file for complete search history.

(56) References Cited

U.S. PATENT DOCUMENTS

| | | | | |
|---|---|---|---|---|
| 6,320,765 B2 * | 11/2001 | Yasumura | ......... | H02M 3/33569 363/21.02 |
| 6,424,544 B1 * | 7/2002 | Svardsjo | ........... | H02M 3/33592 363/127 |
| 6,771,521 B1 * | 8/2004 | Xiong | ..................... | H02M 1/34 363/21.06 |
| 7,088,602 B2 * | 8/2006 | Priegnitz | ................. | H02M 1/34 363/127 |
| 2002/0110005 A1 | 8/2002 | Mao et al. | | |
| 2002/0196002 A1 * | 12/2002 | Diallo | .................... | H02M 1/38 323/276 |

FOREIGN PATENT DOCUMENTS

| | | |
|---|---|---|
| DE | 102008018390 A1 | 10/2009 |
| JP | S63276319 A | 11/1988 |

OTHER PUBLICATIONS

International Search Report based on application No. PCT/EP2014/069014 (4 pages + 2 pages English translation) dated Dec. 3, 2014 (for reference purpose only).

\* cited by examiner

US 9,831,795 B2

SYNCHRONOUS RECTIFIER

RELATED APPLICATIONS

The present application is a national stage entry according to 35 U.S.C. §371 of PCT application No.: PCT/EP2014/069014 filed on Sep. 5, 2014, which claims priority from German application No.: 10 2013 219 015.8 filed on Sep. 20, 2013, and is incorporated herein by reference in its entirety.

TECHNICAL FIELD

Various embodiments relate to a synchronous rectifier including an input including a first and a second input terminal for coupling to an AC voltage source, an output including a first and a second output terminal for providing a DC voltage, at least one transformer including at least one primary winding and at least one secondary winding, wherein the primary winding is coupled in series with the first input terminal; and at least one rectifier cell, wherein the at least one rectifier cell includes: a first and a second terminal, wherein the first terminal of the rectifier cell is coupled to one of the input terminals of the synchronous rectifier, wherein the second terminal of the rectifier cell is coupled to one of the output terminals of the synchronous rectifier; a bipolar main switch including a control electrode, an operating electrode and a reference electrode, wherein the bipolar main switch is coupled between the first and the second terminal of the rectifier cell; a first diode, which is coupled to the collector-emitter path of the bipolar main switch in such a way that it blocks the current flow in forward operation of the bipolar main switch; and the at least one secondary winding, wherein the at least one secondary winding is coupled to the control electrode of the bipolar main switch.

BACKGROUND

In this context, DE 10 2008 018 390 A1 discloses the synchronous rectifiers illustrated in FIGS. 1 and 2, in which a plurality of the type of rectifier cells Gi illustrated in FIG. 3 are used. FIG. 1 shows a synchronous rectifier constructed as a bridge rectifier, while FIG. 2 shows a synchronous rectifier constructed as a push-pull rectifier. For details concerning the structures illustrated in FIGS. 1 to 3, reference is made to the aforementioned DE 10 2008 018 390 A1. As indicated in FIG. 3, the winding sense of the secondary winding of the respective rectifier cell Gi can vary, as can the circumstance of which of the two terminals is used as input and which as output of the rectifier cell, depending on which synchronous rectifier is constructed and depending on the position of the rectifier cell Gi within the respective synchronous rectifier. Therefore, one terminal of the rectifier cell Gi is designated by GE1 or GA1, and the other is correspondingly designated respectively by GA1 or GE1.

In the case of the push-pull rectifier illustrated in FIG. 2, the inductances L1, L2, L3 form a center tapped transformer Tr2, while the inductances L12, L13 arranged in series with the secondary windings L2, L3 of the transformer Tr2 are the primary windings of a control transformer Tr1, the secondary windings of which are arranged in the respective rectifier cells Gi. In comparison with the scenarios known from the paper "A New Synchronous Rectifier Using Bipolar Transistor Driven by Current Transformer" by Sakai, E. and Harada, K., published in 14$^{th}$ International Telecommunications Energy Conference 1992, INTELEC '92, Oct. 4-8, 1992, pages 424-429, in the case of the known scenarios illustrated in FIGS. 1 to 3, the bipolar transistors are turned off in forward operation and are operated in the on state in inverse operation. The range of operating voltages with which such synchronous rectifiers can be operated can be significantly increased as a result. With regard to the further prior art, reference is made to the paper "Improving Efficiency of Synchronous Rectification by Analysis of the MOSFET Power Loss Mechanism", Infineon Application Note AN 2012-03 V2.1 March 2012, the paper "Control Driven Synchronous Rectifier in Phase Shifted Full Bridge Converters", Texas Instruments Application Note SLUA 287, and the paper "A novel high efficient approach to input bridges" by Davide Giacomini and Luigi Chine, presented at the PCIM 2008.

If the rectifier cell Gi illustrated in FIG. 3 is used in the synchronous rectifiers in accordance with FIG. 1 and FIG. 2, then in practice at operating frequencies starting from approximately 20 kHz the resulting efficiency has been unsatisfactory. However, the operation of such synchronous rectifiers with the highest possible frequencies is desirable in order to keep the magnetic components small.

US 2002/0110005 A1 discloses a power converter that uses synchronous rectifiers. FIG. 4 of the aforementioned document illustrates a rectifier cell including a first and a second main switch. A first auxiliary switch is assigned to the first main switch and a second auxiliary switch is assigned to the second main switch. A first capacitor is coupled to a first auxiliary winding, and a second capacitor is coupled to a second auxiliary winding. In order to provide a discharge path for the gate terminals of the main switches when the latter are in the off state, the gate terminal of the first main switch is coupled to that terminal of the first capacitor which is not coupled to the first auxiliary winding, wherein the gate terminal of the second auxiliary switch is coupled to that terminal of the second capacitor which is not coupled to the second auxiliary winding. The source-drain path of the first auxiliary switch is coupled between that terminal of the first capacitor which is not coupled to the first auxiliary winding and the reference potential. In this way, the gate terminal of the first main switch can be discharged by the first auxiliary switch being turned on. The same correspondingly applies with regard to the second auxiliary switch and the second main switch.

SUMMARY

Various embodiments provide a synchronous rectifier of the generic type in such a way that a better efficiency is made possible at operating frequencies beyond 20 kHz.

The present disclosure is based on the insight that, starting from frequencies of approximately 20 kHz, the comparatively long storage time of the bipolar transistors used in the rectifier cells is responsible for the poor efficiency of the synchronous rectifiers known from the prior art. At frequencies of 100 kHz, for example, a half-period of the input signal is 5 μs. By contrast, the storage time of the bipolar transistors used is approximately 1 μs. This has the consequence that the bipolar transistors used can no longer be switched off rapidly enough to effect blocking. As a result, voltage and current occur simultaneously in the transistor, thus giving rise to losses that lead to an undesirably low efficiency of such synchronous rectifiers. In particular, pulsed currents involving comparatively rapid change in current can be followed by the bipolar transistor only with a delay.

That results in an undesirably slow and lossy switch-off process.

The present disclosure eliminates this problem by modifying the driving of the bipolar transistor in comparison with the known rectifier cell Gi in such a way that a significant switch-off acceleration is achieved. This is implemented such that, when the current in the respective rectifier cell tends to zero, this switches off the corresponding bipolar transistor particularly rapidly.

This is achieved in principle by virtue of the fact that the at least one rectifier cell furthermore includes an energy store, which is coupled in series between the secondary winding and the control electrode of the bipolar main switch, and an auxiliary switch including a control electrode, an operating electrode and a reference electrode, said auxiliary switch being coupled between the coupling point of the energy store to the secondary winding, on the one hand, and the first terminal of the rectifier cell, on the other hand, wherein the control electrode of the auxiliary switch is likewise coupled to the at least one secondary winding.

What is achieved in this way is that the auxiliary switch is concomitantly controlled by the relevant secondary winding for the bipolar main switch and ensures that the main switch is switched off before the end of the inverse phase. In the case of an npn bipolar transistor, forward operation here is characterized in that the voltage $U_{ce}$ is greater than zero. It correspondingly holds true in inverse operation that $U_{ce}$ is less than zero. For a pnp bipolar transistors, conversely, the voltage $U_{ce}$ is less than zero in forward operation, while the voltage $U_{ce}$ is greater than zero in inverse operation of said transistor.

The solution according to the disclosure makes it possible to completely avoid reverse currents of the bipolar main switch of a rectifier cell. Thus, the efficiency of a synchronous rectifier constructed therewith increases significantly and an efficient application at frequencies of greater than or equal to 20 kHz, in particular at approximately 100 kHz or more, is made possible.

The disclosure explained hereinafter, which relates to the realization of improved synchronous rectifiers by providing an improved rectifier cell Gi, makes it possible to construct an improved synchronous rectifier not only as a bridge rectifier (see FIG. 1) or as a push-pull rectifier (see FIG. 2), but furthermore also as a half-bridge rectifier, for example as a main rectifier in an isolated flyback converter, or as a current doubler in which one half of a full bridge is replaced by two mutually independent inductances.

In various embodiments, a voltage limiting element, in particular a zener diode, is connected in parallel with the energy store. In this way, it is possible to set a defined, limited voltage at the energy store. Since the losses on the secondary side are proportional to the product of current and voltage of the secondary side, the control losses can be reduced by the voltage being limited by means of the voltage limiting element.

In various embodiments, the energy store constitutes a capacitor.

With further preference, an ohmic resistor is connected in parallel with the control electrode—reference electrode path of the bipolar main switch. As a result, the blocking capability of the bipolar main switch in forward operation is increased, thus resulting in a maximum dielectric strength in a simple manner.

In various embodiments, the auxiliary switch is likewise realized as a bipolar transistor. Thus, it can be fed from the same current source as the bipolar main switch in a particularly simple manner. Accordingly, the transformer whose secondary winding is arranged in the respective rectifier cell is designed as a current transformer. By means of the turns ratio of primary winding to secondary winding, the forced current amplification ratio for the bipolar transistor is set, which should be of the order of magnitude of or less than the saturation current amplification of the bipolar main switch used in inverse operation. For a current transformer, here the impedance ωL should be chosen to be greater than the load impedance through the improved rectifier cell Gi. That is tantamount to the transformer whose secondary winding lies in the respective rectifier cell, during proper operation, building up no appreciable magnetization currents, let alone attaining saturation. Rather, said transformer operates like a current probe that measures the input current of the respective rectifier cell and outputs it again in a manner reduced linearly in accordance with the turns ratio within the rectifier cell.

The depletion of the base charge of the bipolar main switch is effected by means of the auxiliary switch, which amplifies the base current fed to it with its current gain and thus enables comparatively high depletion currents for the bipolar main switch, as a result of which the latter can be switched off very rapidly. A MOSFET transistor as auxiliary switch can also be used in principle, but would entail the disadvantage of a switch-on voltage not fixed as accurately.

In accordance with one preferred embodiment, the auxiliary switch is embodied complementarily with respect to the bipolar main switch. In this way, it is possible, in a particularly simple manner, to couple the base of the bipolar main switch, using the current gain of the auxiliary switch, to the emitter of the auxiliary switch for the purpose of depleting the base of the bipolar main switch.

The rectifier cell preferably includes a second diode, which is coupled in series between the secondary winding and the energy store, wherein the operating electrode of the auxiliary switch is coupled to the coupling point of the second diode and of the energy store. Said second diode is necessary in order that the auxiliary switch remains controllable. If, for example, the energy store is charged and a negative edge occurs at the transformer, said second diode is turned off and the auxiliary switch is switched on.

Furthermore, it is preferred for an ohmic resistor to be coupled between the secondary winding and the control electrode of the auxiliary switch. Said resistor serves for limiting the base current of the auxiliary switch.

In accordance with one preferred embodiment, the rectifier cell furthermore includes a third diode, which is coupled between the reference electrode of the auxiliary switch and the first terminal of the rectifier cell. If the voltage at the control electrode of the auxiliary switch is more negative than the voltage at the operating electrode of the auxiliary switch, then the auxiliary switch is turned on. The third diode prevents charge carriers from being extracted from the base of the bipolar main switch if the latter is intended to be switched on. In other words, inverse operation of the auxiliary switch is prevented.

As already mentioned, different synchronous rectifiers can be realized by means of one or a plurality of rectifier cells according to the present disclosure. Using an individual rectifier cell, it is possible to realize a synchronous rectifier designed for a flyback converter, for example. By means of two rectifier cells, it is possible to realize a synchronous rectifier embodied as a push-pull rectifier; by means of four rectifier cells, it is possible to realize a synchronous rectifier embodied as a full-bridge rectifier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
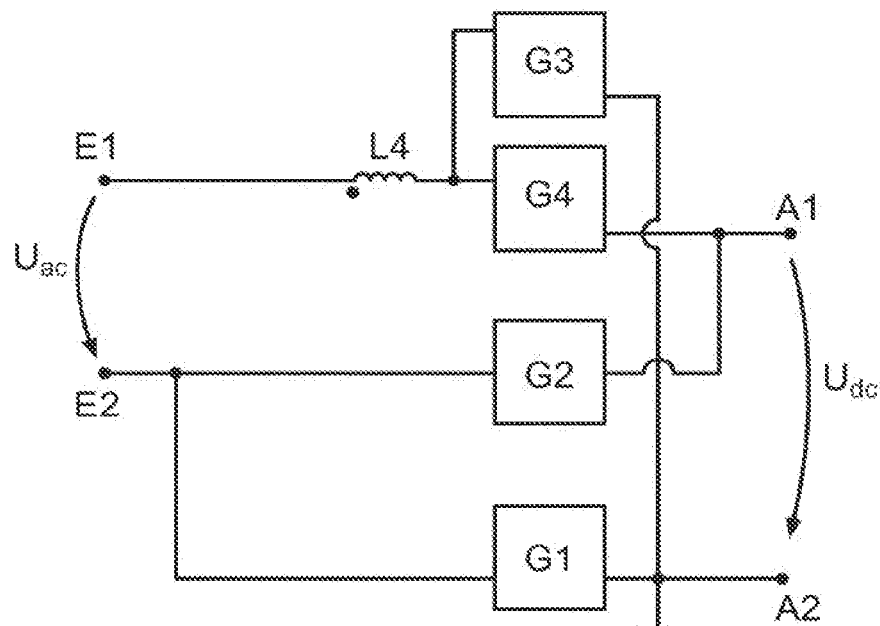
FIG. 1 shows, in a schematic illustration, a synchronous rectifier which is known from the prior art and is embodied as a bridge rectifier.
Figure 2:
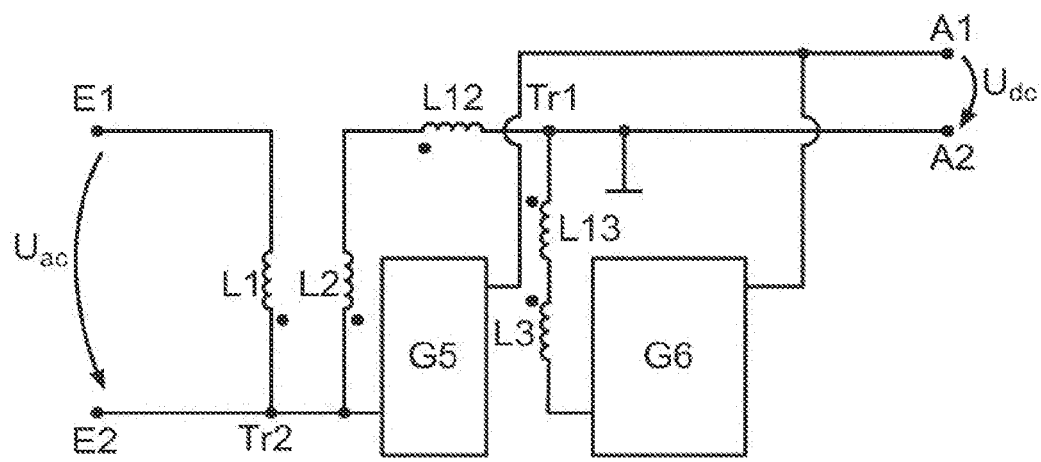
FIG. 2 shows, in a schematic illustration, a synchronous rectifier which is known from the prior art and is embodied as a push-pull rectifier.
Figure 3:
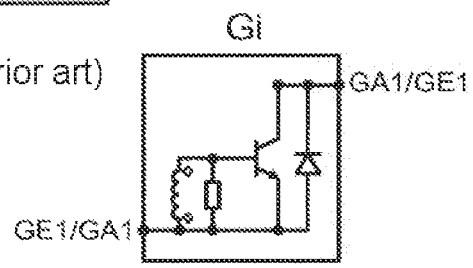
FIG. 3 shows, in a schematic illustration, a rectifier cell Gi which is known from the prior art and can be used in the synchronous rectifiers illustrated in FIGS. 1 and 2.
Figure 4:
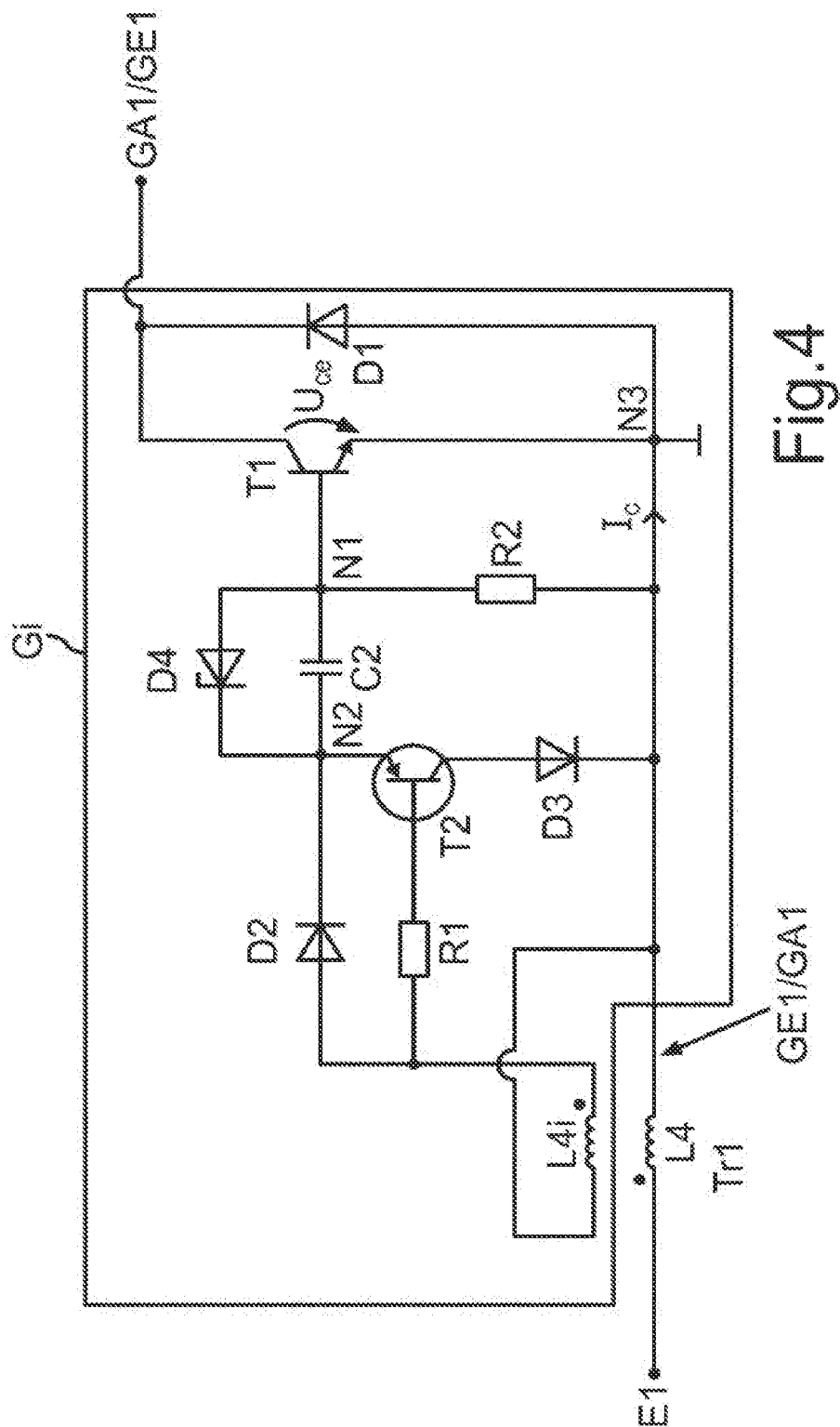
FIG. 4 shows, in a schematic illustration, one embodiment of a rectifier cell Gi according to the invention.

The rectifier cell Gi according to the present disclosure as illustrated in FIG. 4 is described in detail below. With said rectifier cell, synchronous rectifiers according to the present disclosure can be realized as bridge rectifiers, as illustrated in FIG. 1, as push-pull rectifiers, as illustrated in FIG. 2, or as half-bridge rectifiers, for example in the flyback converter.

The rectifier cell Gi includes the secondary winding L4i of a transformer Tr1, the primary winding L4 of which is coupled in series with the first input terminal E1 of the synchronous rectifier. The rectifier cell Gi has a first terminal GE1 or GA1 and a second terminal GA1 or GE1. Which of the terminals GE1 or GA1 is coupled to the input of the synchronous rectifier and which is coupled to the output thereof depends on the position of the respective rectifier cell Gi within the synchronous rectifier.

As mentioned, a secondary winding L4i is in each case arranged in a rectifier cell Gi, wherein the winding sense should likewise be taken into consideration with regard to the respective position within a synchronous rectifier constructed therewith. In this respect, the rectifier cell Gi illustrated in FIG. 4 represents merely one possible embodiment on the basis of which the present disclosure is described in detail below.

The parallel circuit formed by a bipolar main switch T1 and a diode D1 is coupled between the terminals GE1/GA1 and GA1/GE1. In this case, the diode D1 is connected with respect to the collector-emitter path of the bipolar main switch T1 in such a way that it blocks the current flow in forward operation of the bipolar main switch T1. The series circuit formed by a diode D2 and a capacitor C2 is coupled in series between the secondary winding L4i and the control electrode of the bipolar main switch T1, wherein a zener diode D4 is connected in parallel with the capacitor C2 for the purpose of voltage limiting.

An ohmic resistor R2 is connected between the coupling point N1 of the capacitor C2 and of the control electrode of the bipolar main switch T1, on the one hand, and the terminal GE1/GA1, on the other hand. The series circuit formed by an auxiliary switch T2 and a diode D3 is connected between the coupling point N2 of the diode D2 and of the capacitor C2, on the one hand, and the terminal GE1/GA1, on the other hand. The diode D3 is preferably embodied as a Schottky diode. While the bipolar main switch T1 is embodied as an npn transistor, the auxiliary switch T2 is embodied complementarily with respect thereto, that is to say as a pnp transistor, and vice versa. An ohmic resistor R1 is coupled between the secondary winding L4i and the control electrode of the auxiliary switch T2.

Figure 5:
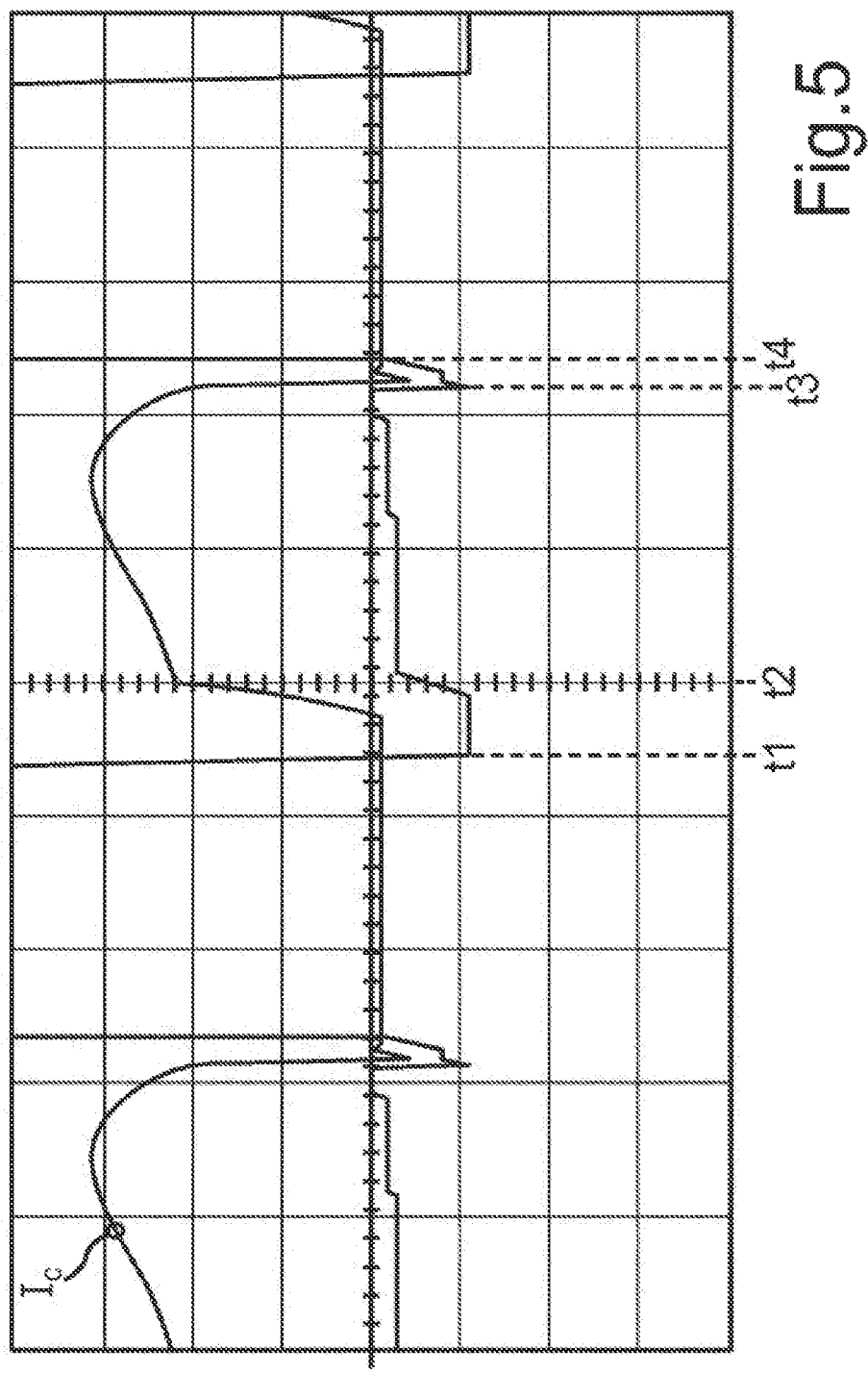
FIG. 5 shows the temporal profile of the collector-emitter voltage $U_{ce}$ of the bipolar main switch and of the collector current $I_c$ of the bipolar main switch of a synchronous rectifier constructed as a bridge rectifier using a rectifier cell according to the invention.

In order to explain the functioning, reference is supplementarily made to FIG. 5, which illustrates the temporal profile of the collector-emitter voltage $U_{ce}$ and of the collector current $I_c$ of the bipolar main switch T1.

If an input voltage $U_{ac}$ is applied between the input terminals E1 and E2 with a load connected to the outputs A1 and A2, a current flows through the winding L4. Owing to the depicted coupling of the windings L4 and L4i, this has the effect that a current likewise flows through the winding L4i. After the occurrence of this current at the point in time t1, firstly the fast diode D1 starts to conduct. The collector-emitter voltage $U_{ce}$ of the transistor T1 decreases from a very high reverse voltage to approximately −1 V dropped across the conducting diode D1. The inverse operation of the transistor T1 thereupon commences, during which a (positive) current flows from the secondary winding L4i via the base of the transistor T1 into the negatively charged collector thereof, see the point in time t2 in the illustration in FIG. 5.

Since the forward voltage dropped across the transistor T1 operated in inverse operation is lower than that dropped across the diode D1, the voltage $U_{ce}$ decreases to −0.2 to −0.3 V at the point in time t2. As a result, the losses can be reduced to approximately one third to one quarter in comparison with a diode. The transistor T1 accepts the current initially flowing via the diode D1 completely between the points in time t2 and t3.

At the point in time t3, the transistor T1 transitions again into the off state, whereupon the diode D1 again accepts the current. Afterward, that is to say during a negative half-cycle of the input voltage $U_{ac}$, the current $I_c$ is approximately zero, wherein, starting from the point in time t4, the diode D1 also transitions into its non-conducting state and the voltage $U_{ce}$ increases to its high reverse value.

In order to make the rectifier cell Gi from FIG. 4 suitable for synchronous rectifiers which have an operating frequency of more than 20 kHz, in particular of up to 100 kHz or more, precautions should be taken to switch off the transistor T1 in inverse operation as rapidly as possible. Toward the end of the inverse phase, a potential of approximately −1 V is present at the collector owing to the diode D1. For the purpose of switching off, the base of the transistor T1 must be more negative than the collector in order to extract charge carriers from the base. Without the capacitor C2, although the base of the transistor T1 would be at a potential of approximately 0 V, it would not be more negative than the −1 V present at the collector. In order to generate a potential of −1 V at the base of the transistor T1, taking account of the fact that the voltage dropped across the switch T2 and the diode D3 is approximately 0.5 V, the capacitor C2 and the diode D4 must be dimensioned such that approximately 2.5 V are dropped across them. It holds true that: $U_c(T1)+U_{ec}(T2)+U_{D3}$=−1 V−0.5 V=−1.5 V; that is to say that, starting from voltages of $U_{c2}$>1.5 V, a negative potential is generated at the base of the transistor T1.

In order that −1 V is present at the base of the transistor T1, the voltage $U_{c2}$ must accordingly be dimensioned at 1.5 V+1 V=2.5 V. Rapid switching off of the transistor T1 in inverse operation is then made possible.

In other words, the capacitor C2 accordingly acts as a voltage source. If the auxiliary switch T2 is turned on, the left terminal of the capacitor C2 is set to approximately reference potential, i.e. the potential at the terminal GE1/GA1. The right terminal of the capacitor C2 is pulled down according to the charge on the capacitor C2. As a result, a negative potential is generated at the base of the transistor T1, as a result of which a turn-off acceleration is obtained.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A synchronous rectifier comprising:
   an input comprising a first and a second input terminal for coupling to an AC voltage source;
   an output comprising a first and a second output terminal for providing a DC voltage;
   at least one transformer comprising at least one primary winding and at least one secondary winding, wherein the primary winding is coupled in series with the first input terminal; and
   at least one rectifier cell, wherein the at least one rectifier cell comprises:
   a first and a second terminal, wherein the first terminal of the rectifier cell is coupled to one of the input terminals of the synchronous rectifier, wherein the second terminal of the rectifier cell is coupled to one of the output terminals of the synchronous rectifier;
   a bipolar main switch comprising a control electrode, an operating electrode and a reference electrode, wherein the bipolar main switch is coupled between the first and the second terminal of the rectifier cell;
   a first diode, which is coupled to the collector-emitter path of the bipolar main switch in such a way that it blocks the current flow in forward operation of the bipolar main switch; and
   the at least one secondary winding, wherein the at least one secondary winding is coupled to the control electrode of the bipolar main switch;
   wherein the at least one rectifier cell further comprises:
   an energy store, which is coupled in series between the secondary winding and the control electrode of the bipolar main switch, and
   an auxiliary switch comprising a control electrode, an operating electrode and a reference electrode, said auxiliary switch being coupled between the coupling point of the energy store to the secondary winding, on the one hand, and the first terminal of the rectifier cell, on the other hand, wherein the control electrode of the auxiliary switch is likewise coupled to the at least one secondary winding.

2. The synchronous rectifier as claimed in claim 1, wherein a voltage limiting element is connected in parallel with the energy store.

3. The synchronous rectifier as claimed claim 1, the energy store constitutes a capacitor.

4. The synchronous rectifier as claimed in claim 1, wherein an ohmic resistor is connected in parallel with the control electrode reference electrode path of the bipolar main switch.

5. The synchronous rectifier as claimed in claim 1, wherein the auxiliary switch constitutes a bipolar transistor.

6. The synchronous rectifier as claimed in claim 4, wherein the auxiliary switch is embodied complementarily with respect to the bipolar main switch.

7. The synchronous rectifier as claimed in claim 1, wherein the rectifier cell further comprises a second diode, which is coupled in series between the secondary winding and the energy store, wherein the operating electrode of the auxiliary switch is coupled to the coupling point of the second diode and of the energy store.

8. The synchronous rectifier as claimed in claim 1, an ohmic resistor is coupled between the secondary winding and the control electrode of the auxiliary switch.

9. The synchronous rectifier as claimed in claim 1, wherein the rectifier cell further comprises a third diode, which is coupled between the reference electrode of the auxiliary switch and the first terminal—of the rectifier cell.

10. The synchronous rectifier as claim 1, wherein the synchronous rectifier comprises exactly one rectifier cell.

11. The synchronous rectifier as claimed in claim 1, wherein the synchronous rectifier comprises two rectifier cells and is embodied as a push-pull rectifier.

12. The synchronous rectifier as claimed in claim 1, wherein the synchronous rectifier comprises four rectifier cells and is embodied as a full-bridge rectifier.

13. The synchronous rectifier as claimed in claim 1, wherein the at least one transformer is embodied as a current transformer.

* * * * *